United States Patent [19]
Usuki et al.

[11] Patent Number: 5,219,834
[45] Date of Patent: Jun. 15, 1993

[54] PROCESS FOR PRODUCING A SUPERCONDUCTING TRANSISTOR

[75] Inventors: Tatsuro Usuki, Osaka; Hiroshi Suzuki, Hirakata; Ichiro Yasui, Shijonawate; Yorinobu Yoshisato, Hirakata, all of Japan

[73] Assignee: Sanyo Electric Co., Ltd., Moriguchi, Japan

[21] Appl. No.: 527,075

[22] Filed: May 21, 1990

[30] Foreign Application Priority Data

May 23, 1989 [JP] Japan .................................. 1-29593

[51] Int. Cl.$^5$ ........................................... H01L 39/24
[52] U.S. Cl. .................................. 505/1; 204/192.24; 427/63; 505/701; 505/702; 505/730; 505/731
[58] Field of Search ............... 505/1, 736, 701, 702, 505/725, 730, 731, 732, 873, 874; 204/192.24; 437/180; 427/62, 63

[56] References Cited

U.S. PATENT DOCUMENTS 4,837,609  6/1989  Gurvitch et al. .................... 505/1

FOREIGN PATENT DOCUMENTS

| 0301525 | 2/1989 | European Pat. Off. |
| 241824 | 10/1988 | Japan . |
| 72425 | 3/1989 | Japan . |
| 82412 | 3/1989 | Japan . |
| 89111 | 4/1989 | Japan . |
| 1-89197 | 7/1989 | Japan . |

OTHER PUBLICATIONS

IEEE *Transactions on Magnetics* vol. Mag 19, No. 3 May 1983.
IEEE *Transactions on Magnetics*, vol. Mag-21 No. 2, Mar. 1985.
Nishio et al., Applied Physics, vol. 56, No. 6, pp. 752-755, (1987).

*Primary Examiner*—John Niebling
*Assistant Examiner*—W. T. Leader
*Attorney, Agent, or Firm*—Morrison Law Firm

[57] ABSTRACT

The present invention provides a process for producing a superconducting transistor on a surface of an insulating substrate. A pre-superconducting thin film contains a material that can be changed into a superconductor during subsequent processing but which is initially a non-superconductor. A thin film containing the material required by the pre-superconducting thin film is deposited in a preferred pattern on the pre-superconducting thin film. The assembly thus formed is heat treated to permit the material from the thin film to enter the pre-superconducting thin film, thereby forming superconducting regions in the pre-superconducting thin film in the preferred pattern. The superconducting regions form electrodes of the transistor.

17 Claims, 14 Drawing Sheets

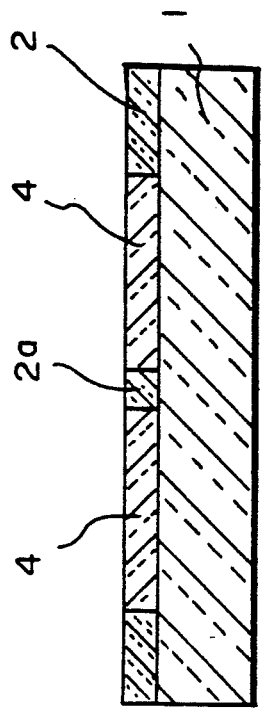
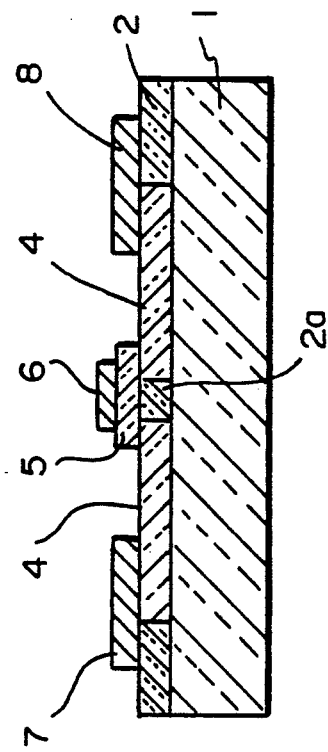
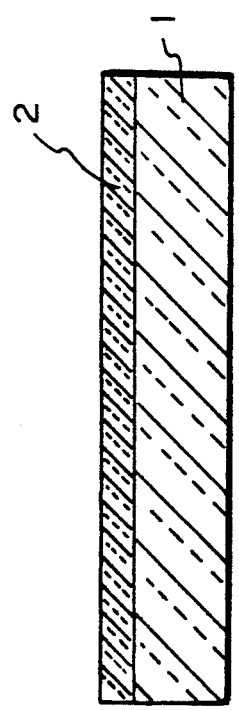
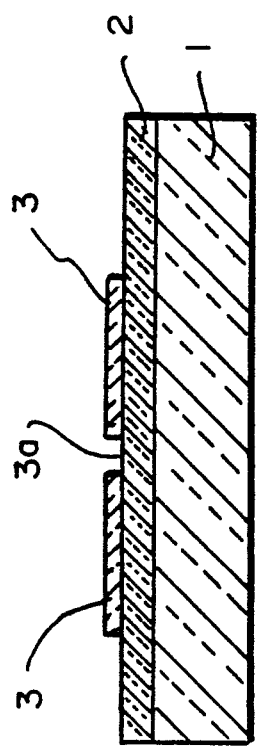

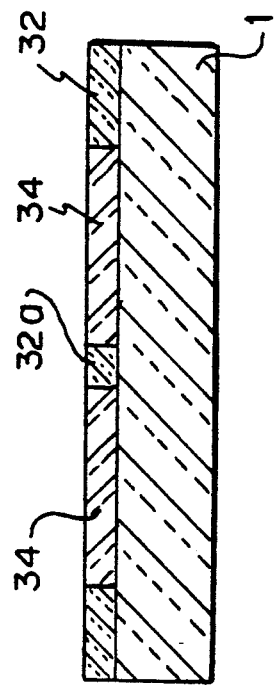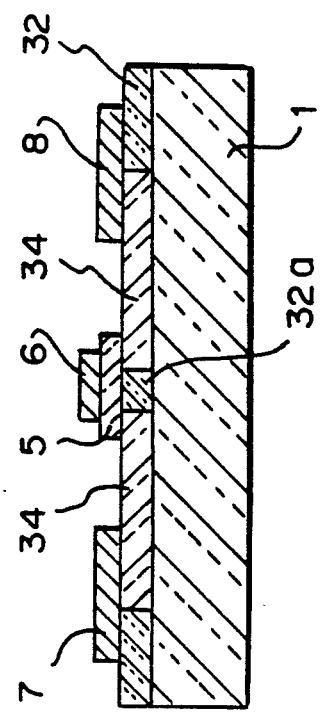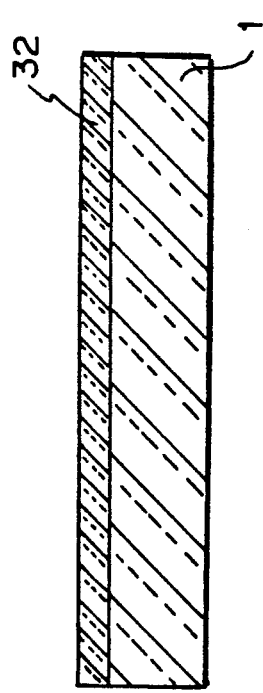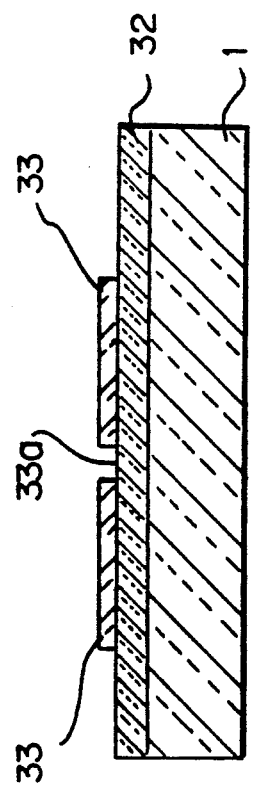

F I G. 15
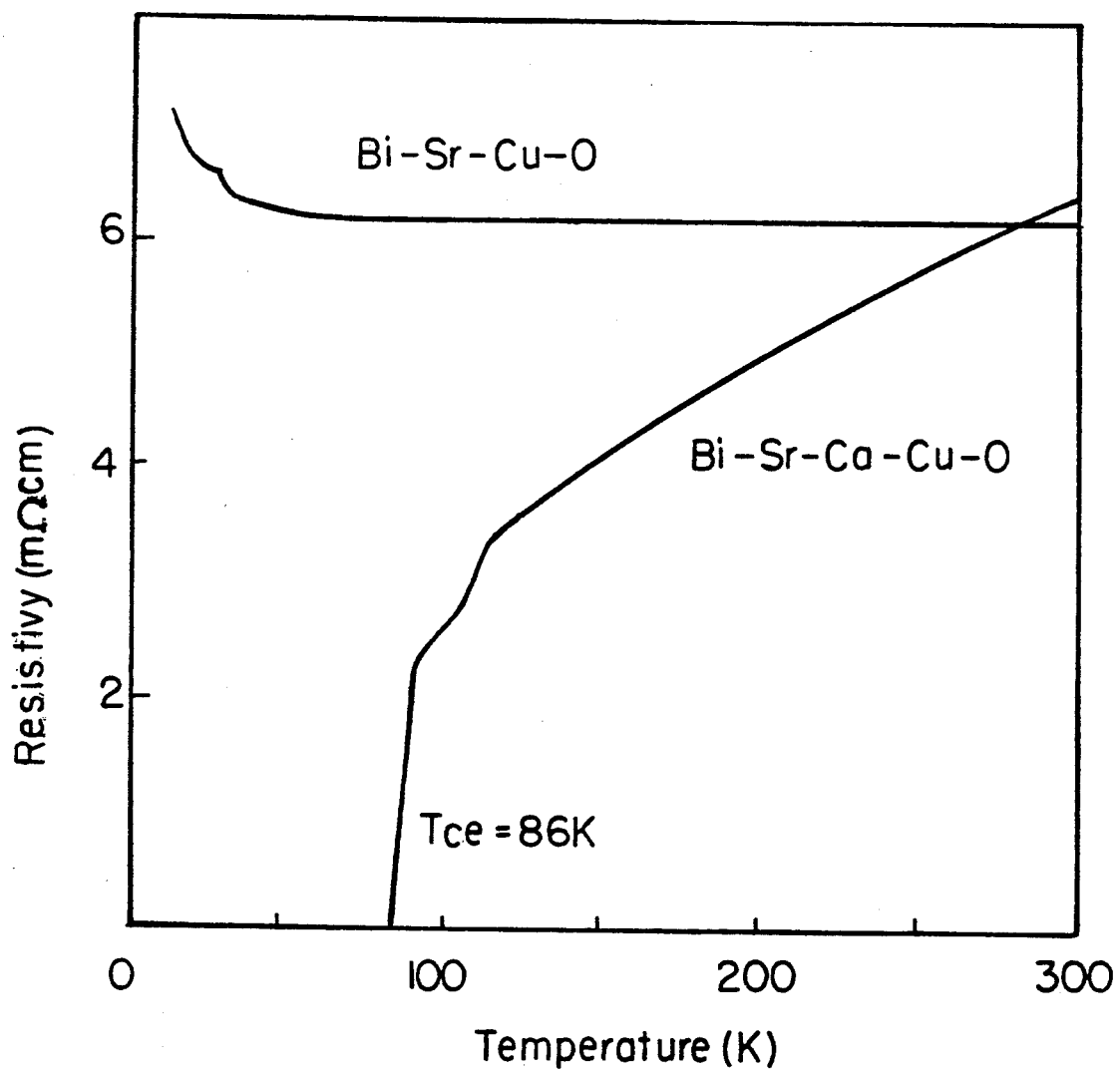

PROCESS FOR PRODUCING A SUPERCONDUCTING TRANSISTOR

BACKGROUND

1. Field of the Invention

This invention relates to process for producing a superconducting transistor using an oxide superconducting material.

2. Description of the Prior Art

In recent years, a proximity-effect-type superconducting transistor has been proposed by, e.g. Japanese scientists Nishino et al in their article entitled "A Superconducting Transistor" in a Japanese periodical publication "Applied Physics" (Vol. 56, No. 6(1987) P 752 to 756).

In a proximity-effect-type transistor, when a superconductor and a normal conductor are in close contact with each other, Cooper pairs induce percolation of charges from the superconductor to the normal conductor. It is possible to make use of a proximity effect for inducing superconductivity on a thin film having a thickness similar to a percolating distance of a normal conductor. That is, when the film thickness is approximately equal to the percolating distance of an SNS junction in which a normal conducting film N is supported between two superconducting films S, Cooper pairs can percolate between superconducting films S due to the proximity effect. The percolating distance is equivalent to the coherence length within a normal conductor. As the temperature is decreased, the percolating distance becomes larger. Further, as the concentration of free electrons is increased, the percolating distance is also increased.

It is difficult to change the concentration of free electrons in a metal. However, in a semiconductor, it is possible to guide a carrier carrying the current to a junction where the concentration of carriers can be changed by providing a field in a manner similar to a field effect transistor.

A proximity-effect-type transistor employs a structure shown in FIG. 16. A source electrode 42 and a drain electrode 43 are formed upon a crystalline silicon plate 41. A gate electrode 44 is formed under the silicon plate 41. Each electrode is a lead alloy superconductor. Numerals 45, 46 and 47 are insulating films.

To produce a conventional proximity-effect-type transistor, the semiconductor and superconductor must be laminated to each other. When forming a high temperature, oxide superconducting thin film upon a semiconductor, the substrate must be heated to more than 800° C. At such temperatures, the superconducting thin film and the semiconductor tend to diffuse into each other. As a result, the properties of the transistor are degraded. For this reason, it has been difficult to laminate, successfully, a high temperature, oxide superconducting thin film with a semiconductor.

There is also proposed a tunnel injection type superconducting transistor which is a known technique. The concept and structure of the tunnel injection type superconducting transistor are disclosed in e.g. *IEEE TRANSACTIONS ON MAGNETICS*, VOL. MAG-21, No. 2 March 1985 "A New Superconducting Base Transistor" P. 721 to 724 or in vol. MAG-19, No. 3, May 1983 "QUITERON" P. 1293 to 1295.

Referring now to FIG. 17, a superconducting transistor comprises a collector area 51 of a semiconductor, a base area 52 of a superconductor thereadjacent and an emitter area 54 of a superconductor. The emitter area 54 of a semiconductor is disposed on base area 52 with a very thin insulating layer 53 between them. Tunnelling may occur through the insulating layer 53.

However, no concrete structure for making the high temperature superconducting transistor of FIG. 17 has yet been proposed. The superconducting transistor is made of Nb material, which requires the super low temperature of liquid helium. None of the above publications teaches a high temperature superconductor that can operate at temperatures attainable with liquid nitrogen.

SUMMARY OF THE INVENTION

It is therefore a first object of this invention to provide a process for producing a superconducting transistor, using a superconducting thin film made of high temperature oxides.

It is a second object of this invention to provide a process for producing a superconducting transistor, which enables the formation of a junction between a semiconductor and a superconductor through which a mutual dispersion of the semiconductor and superconductor cannot occur.

It is a third object of this invention to provide a process for producing a superconducting transistor, which enables the formation of a suitable interface between an area of a superconductive phase and an area of a semiconductor phase thereadjacent.

It is a fourth object of this invention to provide a process for producing a superconducting transistor, in which a pre-superconducting thin film forms a superconducting thin film having an improved surface morphology and a flat plate-shaped crystal. Growth, and thereby adhesion of an insulating film formed on the pre-superconducting thin film, is improved.

It is a fifth object of this invention to provide a process for producing a superconducting transistor, in which none of the ingredients of a pre-superconducting thin film are lost during heat treatment.

It is a sixth object of this invention to provide a process for producing a superconducting transistor, in which in a superconducting thin film in c-axis orientation electric current is supplied in an ab axial direction of a coherence length that is longer than a coherence length in the c-axis direction.

It is a seventh object of this invention to provide a process for producing a superconducting transistor having a monolithic structure in the same chemical group.

It is an eighth object of this invention to provide a process for producing a superconducting transistor, in which a semiconducting layer is a collector and a superconducting layer is a base.

It is a ninth object of this invention to provide a process for producing a superconducting transistor having a structure of a superconducting phase/insulating phase/superconducting phase.

It is a tenth object of this invention to provide a process for producing a superconducting transistor having a structure of a superconducting phase/semiconducting phase/superconducting phase.

Briefly stated the present invention provides a process for producing a superconducting transistor on a surface of an insulating substrate. A pre-superconducting thin film contains a material that can be changed into a superconductor during subsequent processing but which is initially a non-superconductor. A thin film containing the material required by the pre-superconducting thin film is deposited in a preferred pattern on the pre-superconducting thin film. The assembly thus formed is heat treated to permit the material from the thin film to enter the pre-superconducting thin film, thereby forming superconducting regions in the pre-superconducting thin film in the preferred pattern. The superconducting area form one electrode of the transistor.

According to an embodiment of the invention, there is provided a process for producing a superconducting transistor, comprising: forming a first thin film of a pre-superconductor on a surface of a substrate, the first thin film including a deficiency of a component required to make it superconductive, whereby the first thin film is a non-superconductor, depositing a second thin film in a pattern on a surface of the first thin film, the second thin film containing a proportion of the component, and heat treating the substrate with the first and second thin films thereon at a temperature, and for a time, effective to permit transfer of a sufficient portion of the component from the second thin film to the first thin film, to change portions of the first thin film, corresponding to the pattern, into superconducting areas.

According to a feature of the invention, there is provided a process for producing a superconducting transistor, comprising: forming a pre-superconductive first thin film on a surface of an insulating substrate, forming second and third thin films in a pattern on the first thin film, the second and third thin films being separated from each other by a slight gap, the first thin film being deficient in a component required to make it superconductive, the second and third thin films including a proportion of the component, heat treating the assembly formed in the preceding steps for a time and at a temperature effective to permit a sufficient amount of the component from the second and third thin films to enter the first thin film to make first and second superconductive areas in the pattern in the first thin film, forming an insulating film over the slight gap and over contiguous portions of the first and second superconductive areas, forming a gate electrode on the insulating film, forming a source electrode over a portion of the first superconductive area and a contiguous portion of the first thin film, and forming a drain electrode over a portion of the second superconductive area and a contiguous portion of the first thin film.

According to a further feature of the invention, there is provided a process for producing a superconducting transistor, comprising: forming a pre-superconducting first thin film on a surface of a substrate, the first thin film being deficient in a component required for the first thin film to be superconductive, forming a second thin film in a pattern on the first thin film, the second thin film containing a proportion of the component, forming an insulating thin film on the second thin film, forming a third thin film on the insulating thin film, forming a pre-superconducting fourth thin film on the third thin film, the fourth thin film being deficient in the component required for the fourth thin film to be superconductive, the third thin film containing a proportion of the component, heat treating the assembly formed in the preceding steps for a time and at a temperature to permit the component from the second thin film to enter the first thin film in a quantity effective to make a congruent portion of the first thin film a first superconductive region, the step of heat treating being further effective to permit the component from the third thin film to enter the fourth thin film in a quantity effective to make a congruent portion of the fourth thin film a second superconductive region, and the first thin film being a collector, the first superconductive region being a base, and the second superconductive region being an emitter.

According to a still further feature of the invention, there is provided a process for producing a superconducting transistor, comprising: forming a superconducting first thin film on a substrate, forming a second thin film on the first thin film, the second thin film being one of a fluoride and an oxide, and heat treating the assembly formed in the preceding steps.

This invention is characterized in that a thin film containing a material to be changed into a pre-superconducting thin film in a non-superconductive phase state or a semiconductive phase state is deposited on a preferred surface of the pre-superconducting thin film. The material in the thin film is introduced into a preferred part of the pre-superconducting thin film under heat treatment, whereby the preferred part is changed into a superconductive phase.

Accordingly, the preferred portion of the pre-superconducting thin film is transformed into a superconductive phase, but the remaining part remains in a non-superconducting phase. Thus, using a superconducting material made of a high temperature oxide, both the superconductive phase and the non-superconducting phase can be joined to each other. It is thus possible to obtain a suitable interface condition between the superconductive phase area and the non-superconductive phase area thereadjacent.

When a conventional superconducting transistor is heated treated to transform the pre-superconducting thin film into the superconductive phase, the material exhibits needle-shaped crystal growth on a surface of the thin film, so that its surface morphology is inferior. In contrast, according to the present invention, the material in the thin film is formed upon a preferred part of the pre-superconducting thin film, so that it is diffused into the preferred part thereof and none of the ingredients is lost from the pre-superconducting thin film. The surface of the thin film exhibits a flat plate-shaped crystal growth, whereby its surface morphology is improved greatly. Accordingly, a gate electrode can be formed upon an insulating film on the superconductive area to produce a superconducting transistor.

In conclusion, it is possible to produce a first invention; i.e., a MOS-type superconducting transistor and a second invention; i.e., an injection-type superconducting transistor, making use of high temperature oxide superconducting materials.

BRIEF DESCRIPTION OF THE DRAWINGS

FIGS. 1A to 1D respectively are cross-sections illustrating an embodiment of a process for producing a superconducting transistor according to this invention.

FIGS. 12A to 12D are cross-sections illustrating a process for producing a superconducting transistor according to a fourth embodiment of the invention.

FIG. 15 are curves showing the resistivity vs. temperature relationships of superconducting thin films and Bi Sr Cu thin films of the fourth embodiment.

DETAILED DESCRIPTION OF THE INVENTION

First Embodiment

Figure 2:
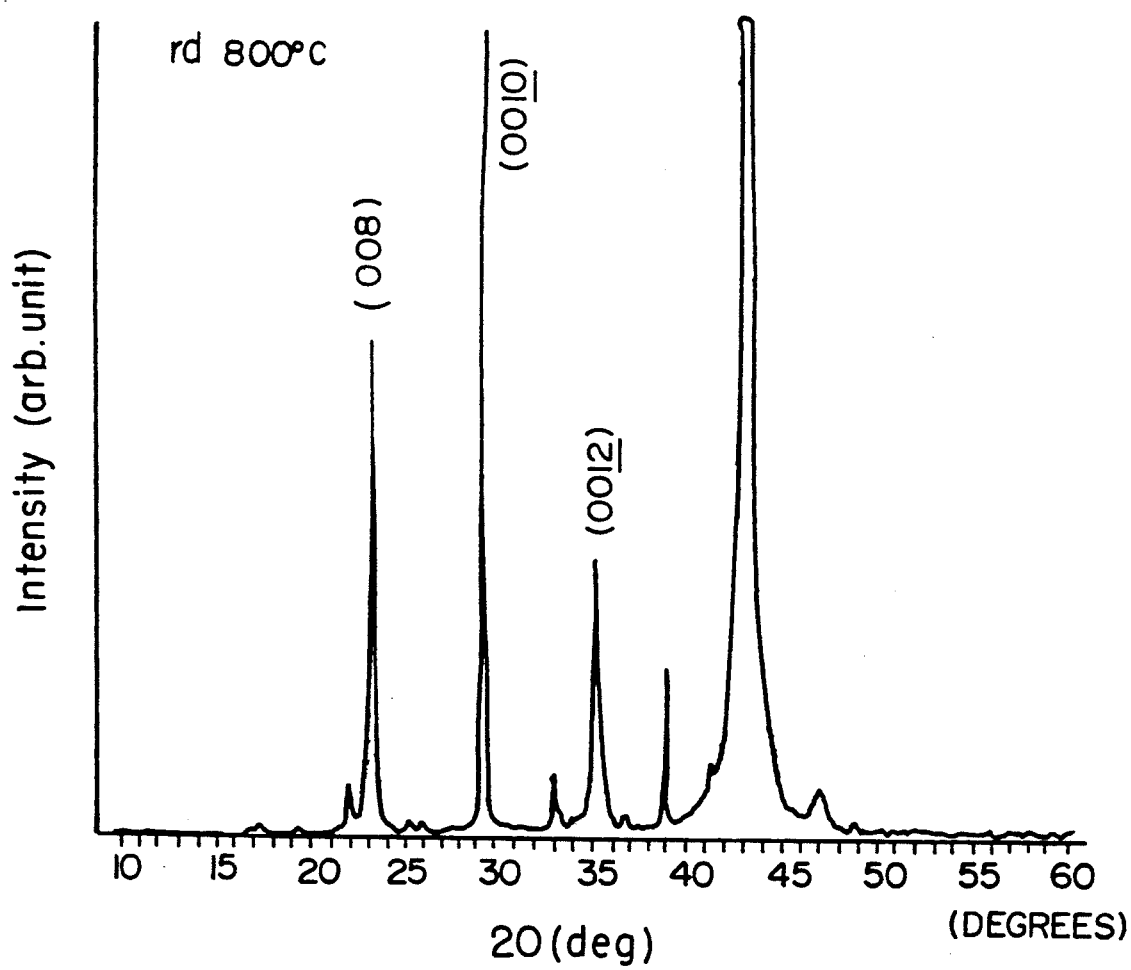
FIG. 2 is an X-ray diffraction pattern of a superconducting thin film of the first embodiment.

FIGS. 1A to 1D show a process for producing a MOS proximity-effect-type superconducting transistor. An insulating substrate 1 is made of (100) Mg O, but may also be Mg O, Sr Ti $O_3$, YSZ (Zirconia stabilized by Yttrium), $Al_2 O_3$, La Al $O_3$ or the like.

A pre-superconducting thin film 2 is formed upon a surface of insulating substrate 1 and shown in FIG. 1A. Thin film 2 has at least a superconductive phase, a semiconductive phase and an insulating phase in the same chemical group. More specifically, thin film 2 is preferably a Bi Si Ca Cu oxide thin film in an amorphous state formed on substrate 1 from a sintered target by means of conventional Rf magnetron spattering.

The sintered target (not shown) is formed by the following solid state reaction of high purity test chemicals.

Four kinds of high purity test chemicals (35 g of $Bi_2 O_3$ of 99.999% purity, 22.1 g of Sr $CO_3$ of 99.99% purity, 15 g of Ca $CO_3$ of 99.99% and 23.9 g of Cu O of 99.99% purity are mixed together. An organic solvent such, for example, methanol or ethanol is added to the mixture. The mixture is agitated by a stirrer to attain a uniform mixture. Then the organic solvent is vaporized. The remaining material is ground by a mortar to transform it into a powder. The powder is baked in an electric furnace for one hour at a temperature of 875° C. The thus baked powder is incorporated into a press to transform it into pellets of about 10 cm diameter and 0.5 thick under a pressure of 760 kg/$cm^2$. The pellets are sintered in the atmosphere for one hour at a temperature of 880° C., thereby producing the sintered target. This sintered target contains the following: $Bi_{1.0} Sr_{1.0} Ca_{1.0} C_{2.0} O_x$. (The numerals indicate the relative amounts of the components.)

Rf magnetron sputtering of the sintered target thus obtained forms the Bi Sr Ca Cu oxide thin film 2 on substrate 1 under the following conditions:

The sintered target is disposed in a bell jar of the sputtering device. The substrate 1 is connected to a grounded positive pole at a distance 40 mm from the sintered target. The sintered target is given a negative high voltage of 1.5 kv.

Argon gas of 99.9995% purity and oxygen gas of 99.999% purity in the ratio of 1:1 are supplied to the bell jar under a pressure of 4 mtorr. A sputtering output of 150 W is maintained until thin film 2, having a thickness of from 300 Å to 10 um, is formed upon substrate 1. The temperature of substrate 1 is maintained at a value of from about 200° to about 600° C. The strength of adhesion of thin film 2 to substrate 1 is variable in accordance with the temperature of substrate 1. Although the adhering strength is increased at higher temperature, there is a growing danger that the ingredients ratio of the thin film may be changed. Therefore, in this embodiment the temperature of substrate is held at 280° C. This produces an evaporating speed of 110 Å/min. Film disposition continues until the thickness of thin film 2 reaches 700 Å. The range of sputter output is 25 to 250 W. If the output is less than 25 W, the discharge becomes unstable. This may crack the sintered target.

When the ingredients ratio of Bi Sr Ca Cu oxide thin film 2 is approximately 1:1:1:2, thin film 2 exhibits superconductivity. When the proportion of Bi is slightly smaller, thin film 2 is a semiconductor. According to this invention, thin film 2 is produced as a pre-superconductor with a slightly reduced proportion of Bi so that its initial state is a semiconducting state, but its state can be changed to a superconducting state in the manner to be described. According to the analysis of the ICP (Induced Coupled Plasma), the ingredients ratio of thin film 2 upon substrate 1 in this embodiment was $Bi_{0.8} Sr_{1.0} Ca_{1.1} Cu_{1.6} O_x$.

As shown in FIG. 1B, thin films 3 of $Bi_2 O_3$ are evaporated upon a surface of thin film 2, thin films 3 are spaced from each other by a slight gap 3a. More specifically gap 3a is from 3000 to 7000 Å in order to supply sufficient Bi to thin film 2. Thin films 3 can be deposited by electron beam evaporation or by sputtering. The preferred embodiment employs electron beam evaporation. The pattern is formed by a metal mask or a lift-off-process employing a photo resist.

Electron beam evaporation was carried out under the conditions of 4 KV of electron beam accelerating voltage and 1 mA of electron beam current. This produced a film deposition speed of 100 Å/min. and a substrate 1 temperature of 200° C. With a thickness of pre-superconducting thin film 2 of 7000 Å, the thickness of $Bi_2 O_3$ thin films 3 can be from 100 to 1200 Å. In the preferred embodiment the thickness of thin films 3 was set to 800 Å.

The slight gap 3a between thin films 3, 3 may be enlarged by the heat treatment.

Substrate 1, having thin films 2 and 3 thereon placed, was in an electric furnace. The assembly was heated at the rate of 5° C./min. to 800° C. The assembly was held at a temperature of 800° C. in an oxygen atmosphere at a flow rate 2l/min to form a superconducting thin film 4 shown in FIG. 1C. The electric furnace was cooled at a rate of 4° C./min. Material of the thin film 3 remaining after the heat treatment may be removed.

During this heat treatment, Bi from thin film 3 is introduced into thin film 2, in which Bi is slightly less than a value permitting superconductivity, thereby increasing the proportion of Bi in thin film 2 to a value which produces superconductivity. At the same time, the amorphous state of thin film 2 is changed to crystalline. A slight gap 2a between superconducting area 4, 4 remains semiconducting. The interface between the superconducting areas 4, 4 and the semiconductor gap 2a are formed of ingredients from the same group, so such interface is very suitable.

An ICP survey shows that the superconducting thin film 4 contain ingredients in the following proportions: $Bi_{1.0} Sr_{1.0} Ca_{1.1} Cu_{1.6} O_x$.

Figure 3:
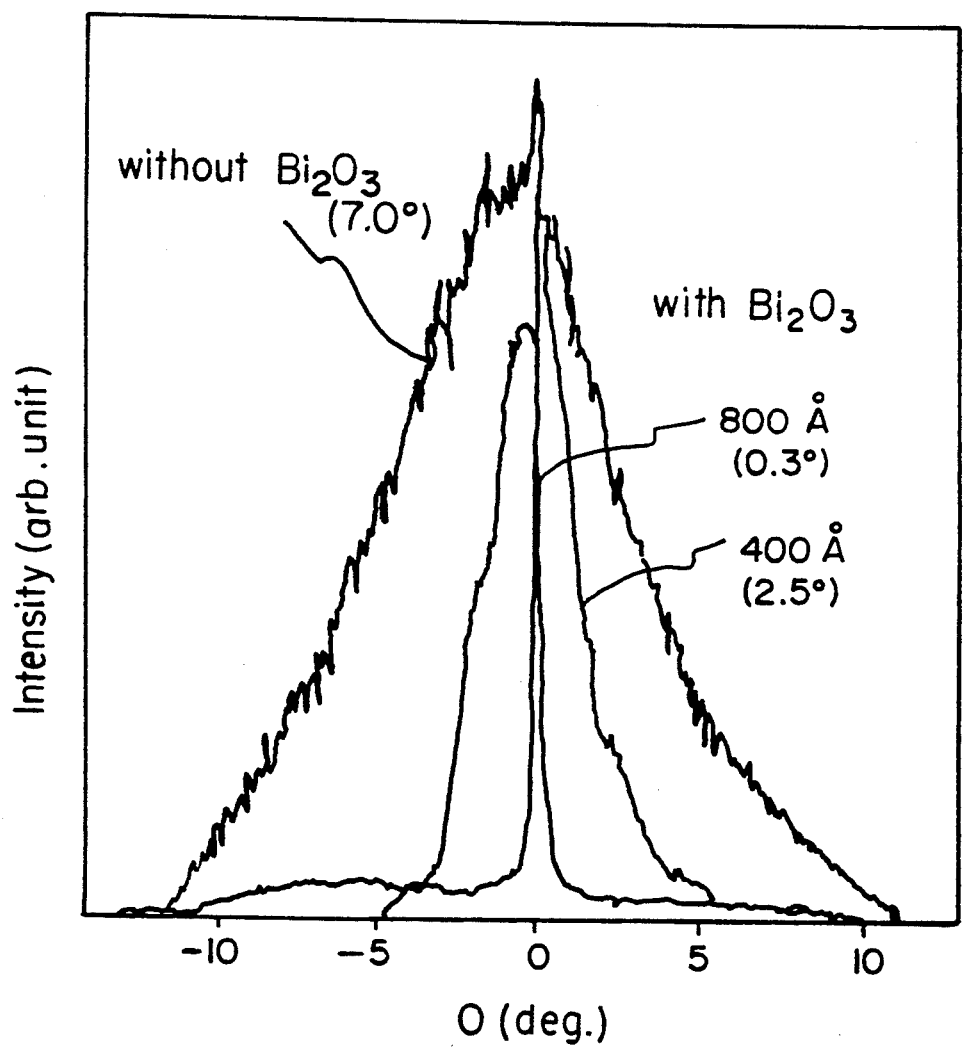
FIG. 3 is a rocking curve of an (008) surface of the superconducting thin film of the first embodiment.

FIG. 2 shows X-ray diffraction patterns of superconducting thin films 4. We checked the crystallinity of thin films 4 from the rocking curve of (008) diffraction peak. FIG. 3 shows the results. As shown in FIG. 3, with a thickness of the $Bi_2 O_3$ thin film of 800 Å, the half width after heat treatment is 0.3°. The half width of a non-$Bi_2 O_3$ thin film is 7.0°, showing that crystallinity is improved. FIG. 3 also shows a case where a 400 Å thickness of $Bi_2 O_3$ thin film is formed, followed by heat treatment.

Under a scanning electron microscope or an optical microscope, we have compared the surface of superconducting thin films produced by heating pre-superconducting thin film 2 under the same conditions as this embodiment, but with no $Bi_2 O_3$ thin film 3, with the surface of superconducting thin films 4 in which $Bi_2 O_3$ thin films 3 were employed. Without thin film 3 a needle-shaped crystalline growth was observed. With thin film 3, a flat plate-shaped crystalline growth was observed.

Figure 4:
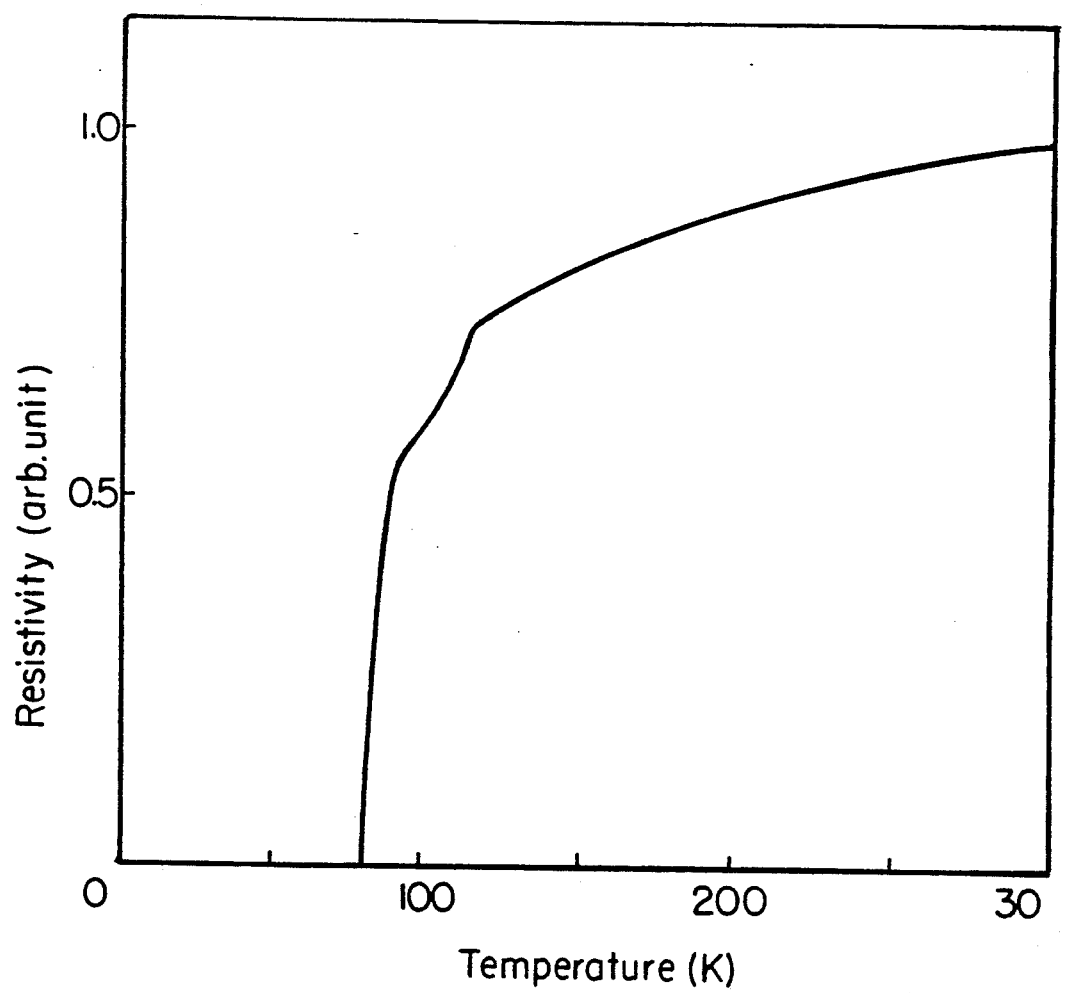
FIG. 4 is a curve showing the resistivity vs. temperature relationship of the superconducting thin film of the first embodiment.

The resistivity vs. temperature of superconducting thin films 4 is shown in FIG. 4, the critical temperature to (onset of superconductivity) was 110K, while Tc (zero)(may also be called "Tce") was 83K.

Figure 5:
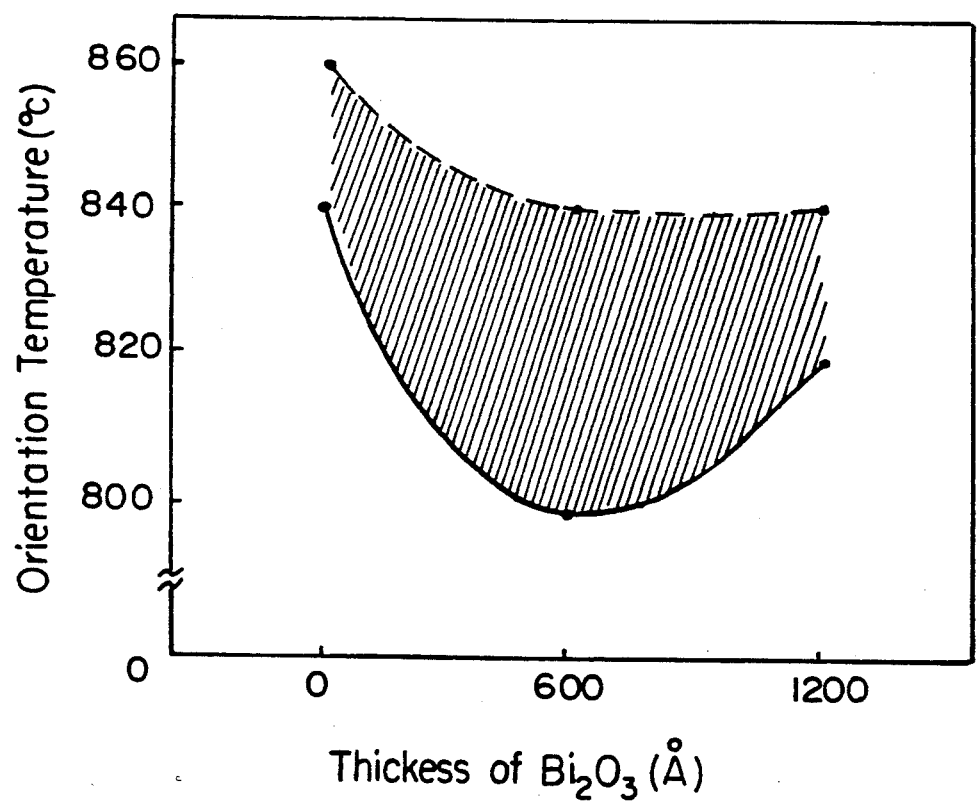
FIG. 5 is a curve showing a relationship between a thickness of $Bi_2O_3$ thin film and the heat treating temperature.

The temperature for heat treatment depends on the thickness of $Bi_2 O_3$ thin film 3. As shown in FIG. 5, when the thickness of $Bi_2 O_3$ thin film 3 is about 600 Å, 800° C. is the lowest temperature that produces superconductivity. If the thickness is either increased or decreased from this value, the minimum temperature for producing superconducting Bi Sr Ca Cu oxide thin film 2 increases. In FIG. 5, the hatched portion shows a range of conditions producing superconductivity in a high c-axis orientation.

Referring to FIG. 1D, an insulating film 5 is disposed over portions of superconducting thin films 4, 4 and over gap 2a. Film 5 may be an oxide film. A gate electrode 6 is formed on insulating film 5. A source electrode 7 is disposed on one of superconducting thin films 4. A drain electrode 8 is disposed on the other of superconducting thin films 4. Source electrode 7 and drain electrode 8 are made of Au and are electrically connected to their respective superconducting thin films 4, 4.

Although insulating film 5 may be made of MgO, $SiO_2$, $Y_2O_3$, or $Al_2O$, this embodiment uses a MgO insulating film. The thickness of insulating film 5 was built up to 1000 Å using electron beam evaporation. In this case, the film forming speed was 10 Å/sec, and the substrate temperature was 300° C.

The thickness of electrodes 6, 7, 8 was built up of Au to 6000 Å, using electron beam evaporation. The operating conditions of the electron beam evaporation is the same as used to produce insulating film 5. The film growing speed was 20 Å/sec.

In the foregoing embodiment, the thickness of pre-superconducting thin film 2 was 7000 Å. When a thickness of 1000 Å was used, the thickness of $Bi_2 O_3$ thin film 3 was 20 Å to 170 Å. After heat treatment, a superconducting thin film 4 having a superior superconducting property was obtained.

If the thickness of the pre-superconducting thin film 2 is d, and the thickness of $Bi_2 O_3$ thin film 3 is x, it is possible to obtain a suitable superconducting thin film 4 by heat treatment when: $0.02d \times 0.17d$.

Second Embodiment

FIGS. 6A to 6D show the steps in a process for producing a tunnel injection-type and proximity-effect-type superconducting transistor.

Figure 6C:
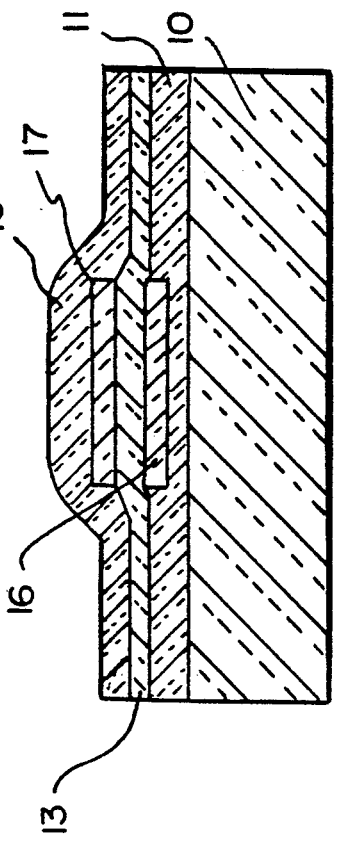
FIGS. 6A to 6D are cross-sections illustrating a process for producing a superconducting transistor according to a second embodiment of the invention.

In this embodiment, an insulating substrate 10 was the same (100) MgO substrate used in the first embodiment. As shown in FIG. 6A, a Bi Sr Ca Cu oxide thin film 11 of 7000 Å thickness is formed on insulating substrate 10. The Bi in thin film 11 is slightly short of an amount necessary to render thin film 11 superconducting. The thin film 11 is identical with thin film 2 in the first embodiment and has been formed under the same conditions using the same method.

A first $Bi_2 O_3$ thin film 12 of 800 Å thickness was evaporated on a limited surface of thin film 11. The evaporating method and conditions were the same as for the formation of films 3 in the first embodiment.

Figure 6D:
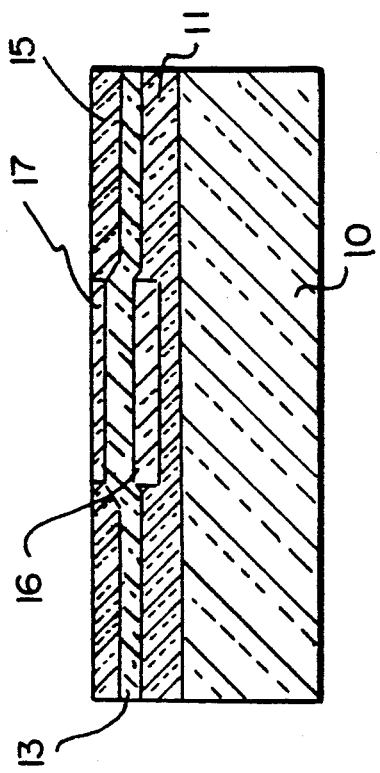
Figure 6A:
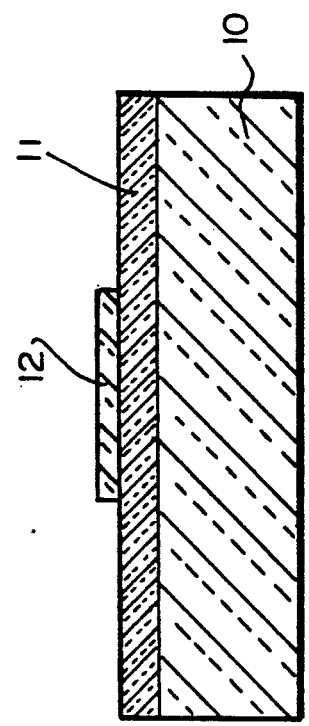
Figure 6B:
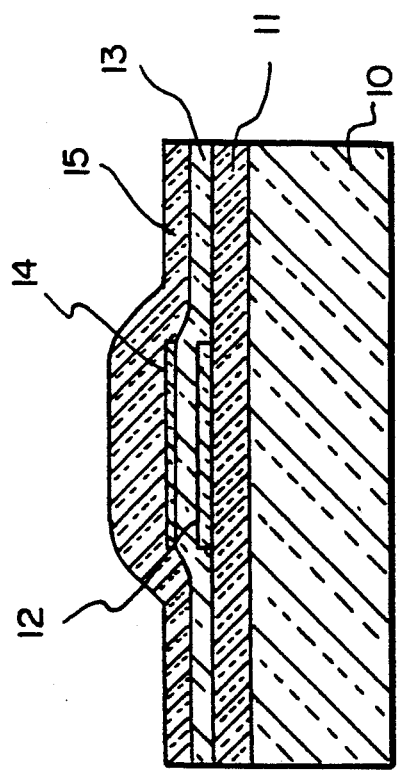

As shown in FIG. 6B, a very thin insulating thin film 13 of 100 Å thickness covered the entire surface of Bi Sr Ca Cu oxide thin film 11 as well as of $Bi_2 O_3$ thin film 12. Tunnelling through insulating thin film 13 occurs during operation of the completed device. The insulating thin film 13 can be made of MgO or $ZrO_2$ and can be deposited by sputtering or evaporation. In this embodiment, a MgO insulating thin film 13 was formed by sputtering. Referring to the conditions of the sputtering method, a MgO target of 10 cm in diameter was employed and argon gas of 99.9995% in purity and oxygen gas of 99.999% in purity were supplied at the ratio of 1:1 and under a pressure of 4 mtorr. The sputtering output was 100 W.

A second $Bi_2 O_3$ thin film 14 identical with $Bi_2 O_3$ thin film 12 was evaporated over insulating thin film 13 in registration with insulating thin film 12. The evaporating method and other conditions, as well as the thickness, were the same as those of the first $Bi_2 O_3$ thin film 12.

A Bi Sr Ca Cu oxide thin film 15 in a semiconductor phase state, in which Bi is slightly short, was evaporated over the entire surface of insulating thin film 13 as well as $Bi_2 O_3$ thin film 14. The evaporating method, conditions and thickness, were the same as those of Bi Sr Ca Cu oxide thin film 11.

The substrate 10 on which thin films were formed one above another was heat-treated in an electric furnace under the same conditions as the first embodiment. As a result, as shown in FIG. 6C, Bi within $Bi_2 O_3$ thin films 12 and 14 was introduced into Bi Sr Ca Cu oxide thin films 11 and 15, in which Bi is slightly short; thereby a pair of superconducting areas 16, 17 were formed, supporting insulating thin film 13 therebetween.

Subsequently, as shown in FIG. 6D, Bi Sr Ca Cu oxide thin film 15 which is positioned on a surface of substrate 10 was etched using a reactive ion etching method, until a superconducting area 17 was exposed. This produces an injection-type transistor, in which superconducting area 17 is an emitter, superconducting area 16 is a base and semiconducting area 11 is a collector.

The ingredients of the thus obtained superconducting areas 16 and 17 have been examined by the ICP and the XPS (X-ray Photoelectron Spectroscopy), and it has been found that the ingredients were in the ratio of $Bi_{1.0}$ $Sr_{1.0}$ $Ca_{1.1}$ $Cu_{1.6}$ $O_x$.

X-ray diffraction patterns of superconducting areas 16, 17 were the same as those in FIG. 2. The rocking curve on (008) surface was the same as that in FIG. 3.

Using a SEM or an optical microscope, we have compared the surface of the superconducting thin film in which pre-superconducting thin film was heat-treated, but without forming $Bi_2 O_3$ thin films 12, 14 with the surfaces of the superconducting areas 16 and 17 in which $Bi_2 O_3$ thin films 12 and 14 have been formed. In the former, a needle-shaped crystalline growth was observed, while in the latter, a flat plate-shaped crystalline growth was observed.

The resistivity vs. temperature of superconducting areas 16, 17 was measured. As a result, the critical temperature Tc (onset) was 110K, while Tc (zero) was 81K.

When the area of the emitter was $20 \times 20$ um$^2$, the base current density was $1 \times 10^4$ A/cm$^2$ and the collector reaching ratio was 0.8.

Third Embodiment

This embodiment is a modification of the first embodiment. In the first embodiment, $Bi_{1.0}$ $Sr_{1.0}$ $Ca_{1.0}$ $Cu_{2.0} O_x$ was used as a sintered target for Rf magnetron sputtering. In this embodiment, a sintered target of $Sr_{1.0}$ $Ca_{1.0} Cu_{2.0} O_x$ was used. Bi is omitted from the sintered target in this embodiment.

A sintered $Sr_{1.0} Ca_{1.0} Cu_{2.0} O_x$ target was prepared without $Bi_2 O_3$, but otherwise using the same method as the first embodiment.

Figure 7A:
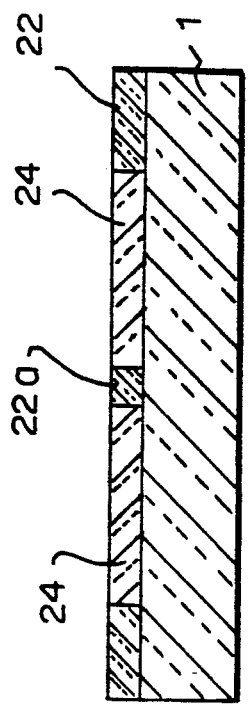
FIGS. 7A to 7D are cross-sections illustrating a process for producing a superconducting transistor according to a third embodiment of the invention.
Figure 7B:
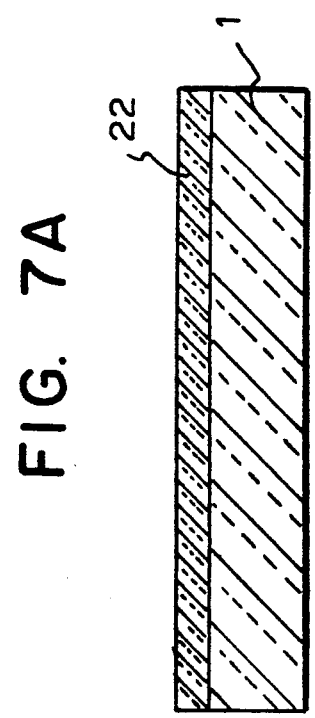

The sintered $Sr_{1.0} Ca_{1.0} Cu_{2.0} O_x$ target was sputtered under the same conditions and using the same equipment as the first embodiment to form a Sr Ca Cu oxide thin film 22 on substrate 1 as shown in FIG. 7A. The ICP analysis shows that the ingredients of this thin film were in the proportions of $Sr_{2.0} Ca_{1.6} Cu_{3.8} O_x$. FIGS. 7A to 7D show a process for producing MOS type and proximity-effect-type superconducting transistors according to this embodiment in steps which correspond to the process of FIGS. 1A to 1D.

Using the same electron beam evaporating method as the first embodiment, $Bi_2 O_3$ thin films 23 were patterned on a surface of thin film 22.

The subsequent heat treatment was a bit different from the first embodiment; namely, the heat treatment was carried out at a temperature of 870° C.

Figure 7C:
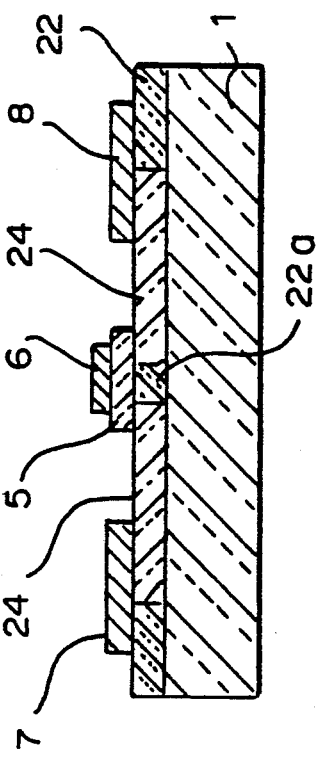
Figure 7D:
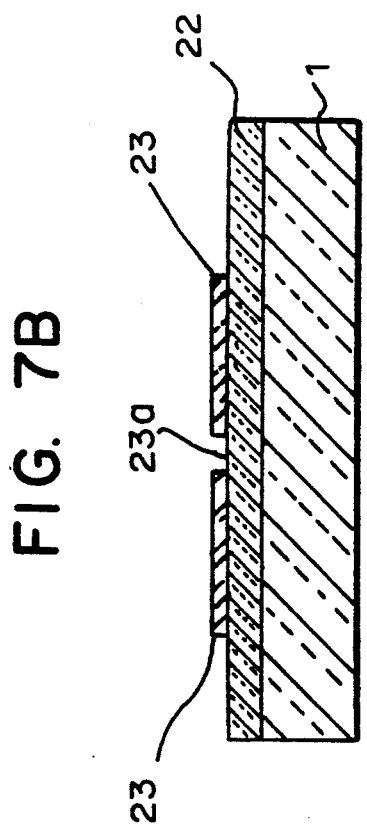
Figure 8:
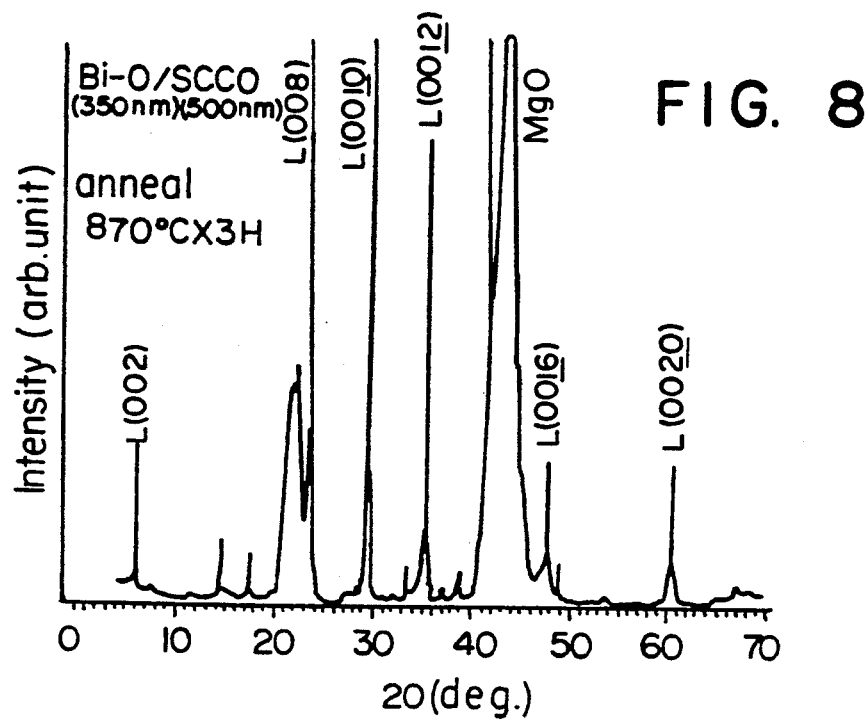
FIGS. 8 and 9 are X-ray diffraction patterns of superconducting thin films under different conditions of the third embodiment.
Figure 9:
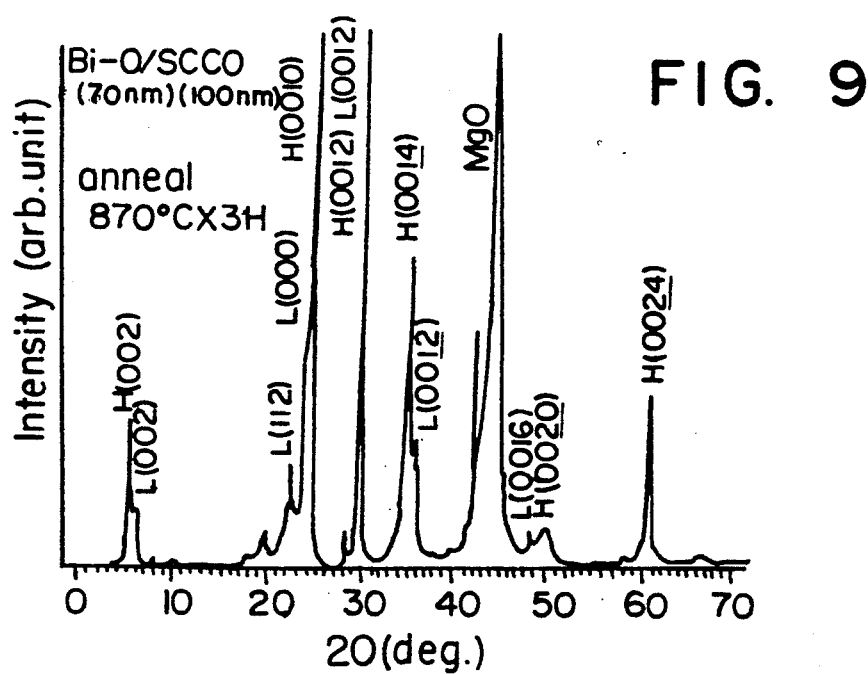

With a thickness of the Sr Ca Cu oxide thin film 22 of 6000 Å, and that of $Bi_2 O_3$ thin film 23 of 1500 to 5000 Å, Bi Sr Ca Cu O thin films 24, as shown in FIG. 7C, were found to have a mixed phase in which the ratio of high Tc phase is large as shown in the X-ray diffraction patterns in FIG. 9.

Figure 10:
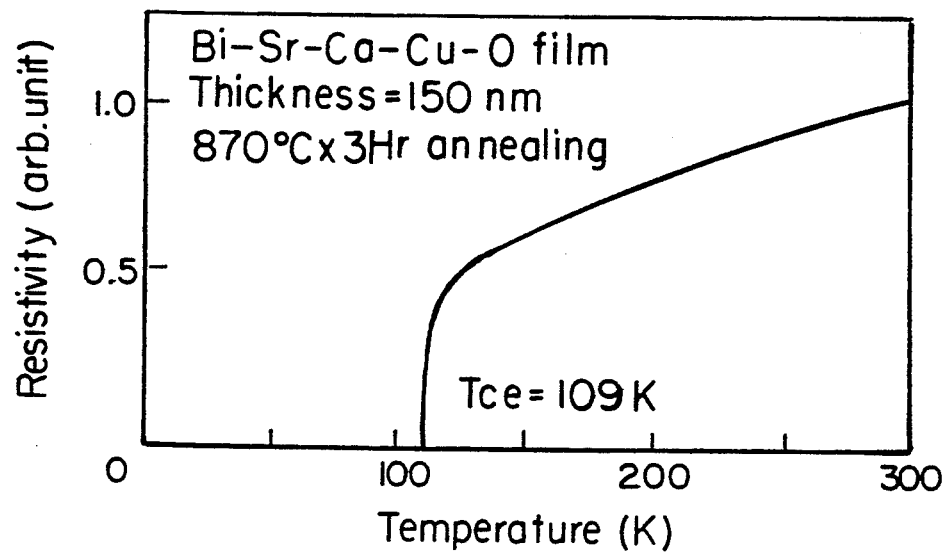
Figure 11:
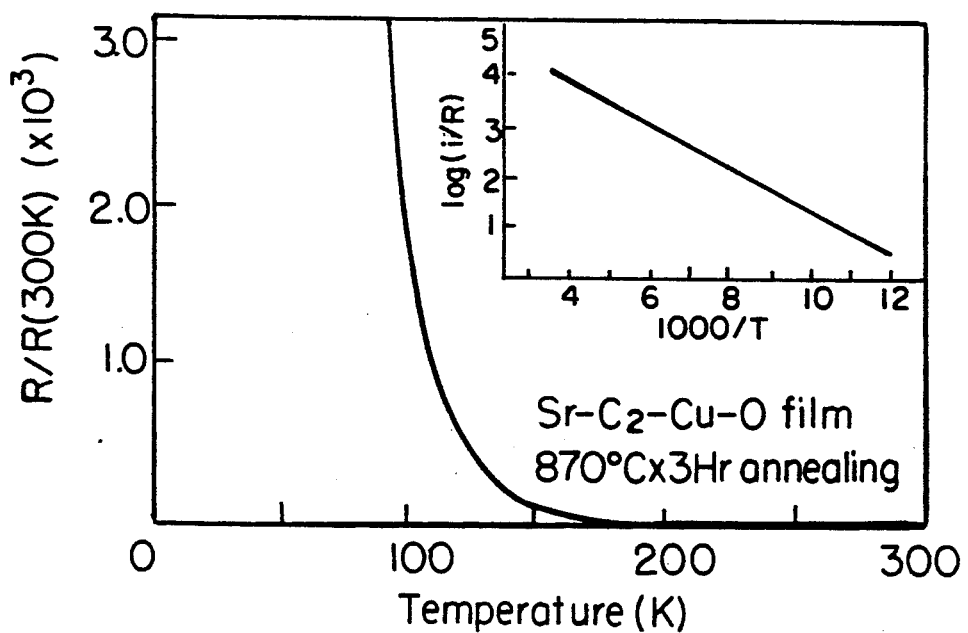
FIG. 11 is a curve showing the resistivity vs. temperature relationship of Sr Ca Cu O thin films of the third embodiment.

FIG. 10 shows the resistivity vs. temperature of the Bi Sr Ca Cu O thin film 24. FIG. 11 shows the resistivity vs. temperature of the Sr Ca Cu oxide thin film 22. As shown in FIG. 10, Tc (zero) of Bi Sr Ca Cu O thin film 24 is 109K. In FIG. 11, the Sr Ca Cu oxide thin film 22 exhibits the temperature/resistance property of a semiconductor. Its resistance is three figures higher than the Bi Sr Ca Cu O thin film 24 at room temperature, and it has a nearly insulating resistance at low temperatures.

At a temperature of less than 109K, a superconductive phase/insulating phase/superconductive phase is formed between a pair of Bi Sr Ca Cu O thin films with a Sr Ca Cu oxide thin film 22 therebetween.

When the gap between $Bi_2 O_3$ thin films 23, 23 is 5000 Å, an insulating film 5 of MgO, $SiO_2$, $Y_2O_3$, or $Al_2O_3$, having a thickness of 1000 Å, is formed over the pair of Bi Sr Ca Cu O superconducting thin films 24, 24, as well as over the Sr Ca Cu oxide thin film 22 therebetween. Gate electrode 6, made of Au or Al, is formed on insulating film 5. Alternatively, insulating film 5 may be made of MgO, $SiO_2$, $Y_2O_3$, or $Al_2O$.

When the thickness of the $Sr_{2.0} Ca_{1.66} Cu_{3.8} O_x$ thin film 22 is d, and that thickness of the $Bi_2 O_3$ thin film 3 is x, a Bi Sr Ca Cu O superconducting thin film shows a suitable superconduction when:

0.3d × 0.8d.

Fourth Embodiment

This embodiment is a modification of the first embodiment. In the first embodiment, $Bi_{1.0}$ $Sr_{1.0}$ $Ca_{1.0}$ $Cu_{2.0} O_x$ was used as a sintered target for Rf magnetron sputtering. In this embodiment $Bi_{1.0}$ $Sr_{1.0}$ $Cu_{2.0} O_x$ is used. Ca is not included.

A $Bi_{1.0}$ $Sr_{1.0}$ $Cu_{2.0} O_x$ target has been prepared using the same method as the first embodiment, but without Ca C $O_3$.

The material of the $Bi_{1.0}$ $Sr_{1.0}$ $Cu_{2.0} O_x$ target was sputtered under the same conditions as the first embodiment. Then, a Bi Sr Cu oxide thin film 32 was formed upon substrate 1 shown in FIG. 12A. The ICP analysis showed that the ingredients of this film were $Bi_{1.0} Sr_{2.0} Cu_{3.1} O_x$. FIGS. 12A to 12D show steps of a process for producing a MOS type and proximity-effect-type superconducting transistor which corresponds to the steps in FIGS. 1A to 1D.

A Ca $F_2$ thin film 33 was patterned upon a surface of thin film 32 by means of the same electron beam evaporation as in the first embodiment.

The Ca $F_2$ thin film 33 was formed under the following conditions: film forming speed 10 Å/sec. on a substrate made of Bi Sr Cu O/MgO, substrate temperature 100° to 300° C. and the thickness of the thin film 33 was 500 to 5000 Å.

The heat treatment conditions after having formed the Ca $F_2$ thin film 33 were the same as in the first embodiment.

Table 1 shows the relationship between the thickness of Ca $F_2$ thin film 33 on $Bi_{1.0} Sr_{2.0} Cu_{3.1} O_x$ thin film 32 having 1000 Å thickness and proportions of the ingredients of the heat-treated Bi Sr Ca Cu O thin film 33 as shown in FIG. 12c.

TABLE 1

| CaF Thin Film (Å) | Composition of BiSrCaCuO Films | | | |
|---|---|---|---|---|
| | Bi | Sr | Ca | Cu |
| 300 | 10 | 2.0 | 0.8 | 3.1 |
| 500 | 10 | 2.0 | 1.5 | 3.1 |
| 700 | 10 | 2.0 | 2.4 | 3.1 |
| 1100 | 10 | 2.0 | 3.8 | 3.2 |

When the thickness of the Bi Sr Cu oxide thin film 32 is 1000 Å and that of Ca $F_2$ thin film 33 is 500 to 700 Å, under the same heat-treatment conditions as the first embodiment; i.e., 870° C. and 3 hours, Bi Sr Ca Cu O thin film 34 showed a crystalline film of low Tc phase and Bi Sr Cu oxide thin film 32 showed a Bi Sr Cu O crystalline film.

Figure 13:
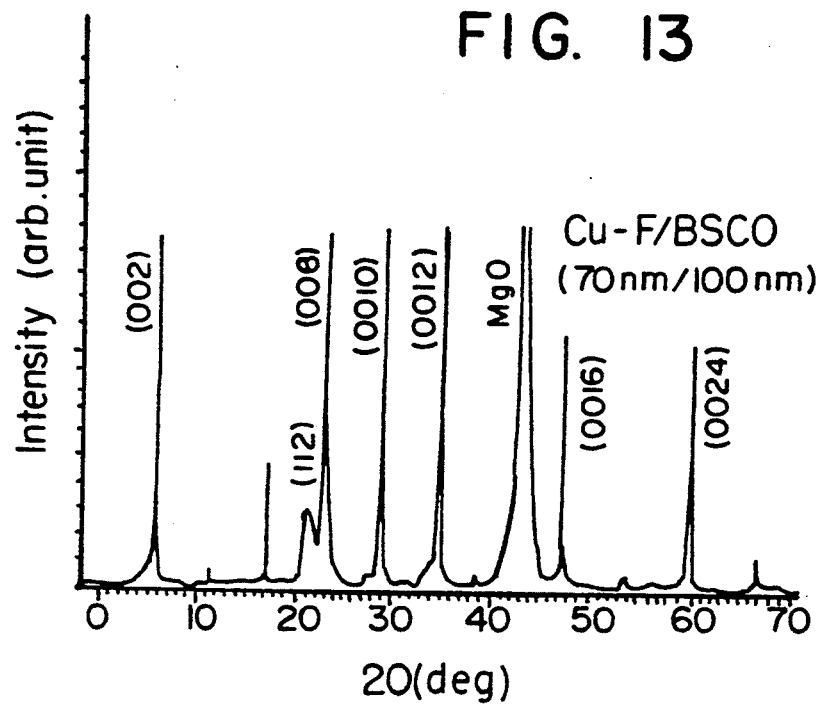
FIGS. 13 and 14 are curves showing X-ray diffraction patterns of the fourth embodiment of the superconducting thin films under different conditions.
Figure 14:
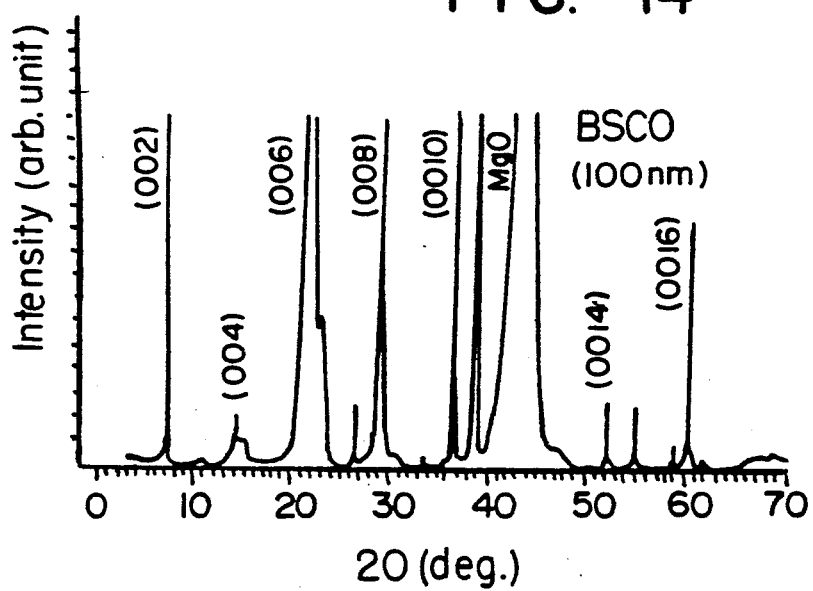
Figure 16:
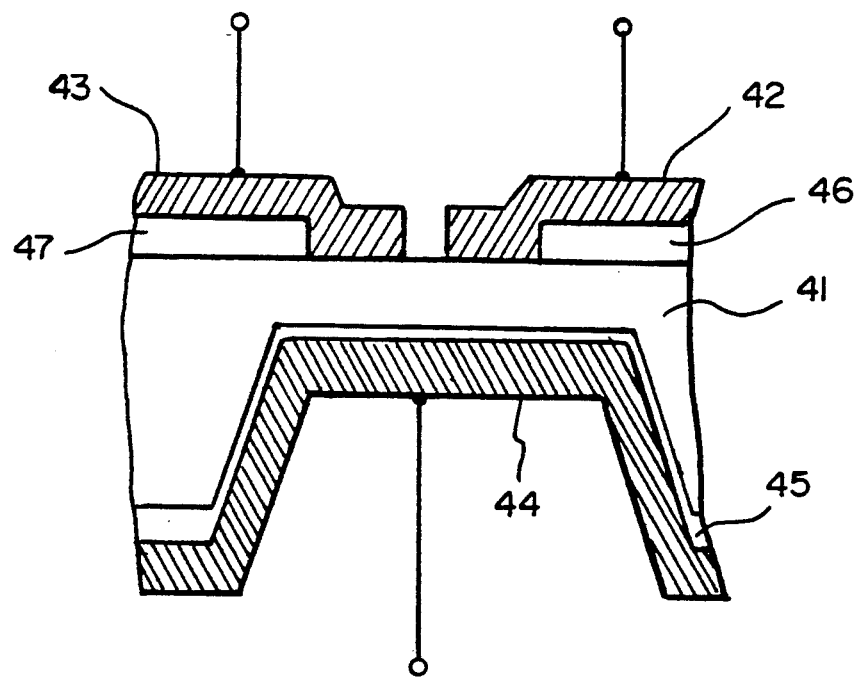
FIGS. 16 and 17 respectively are cross-sections of superconducting transistors according to the prior art.
Figure 17:
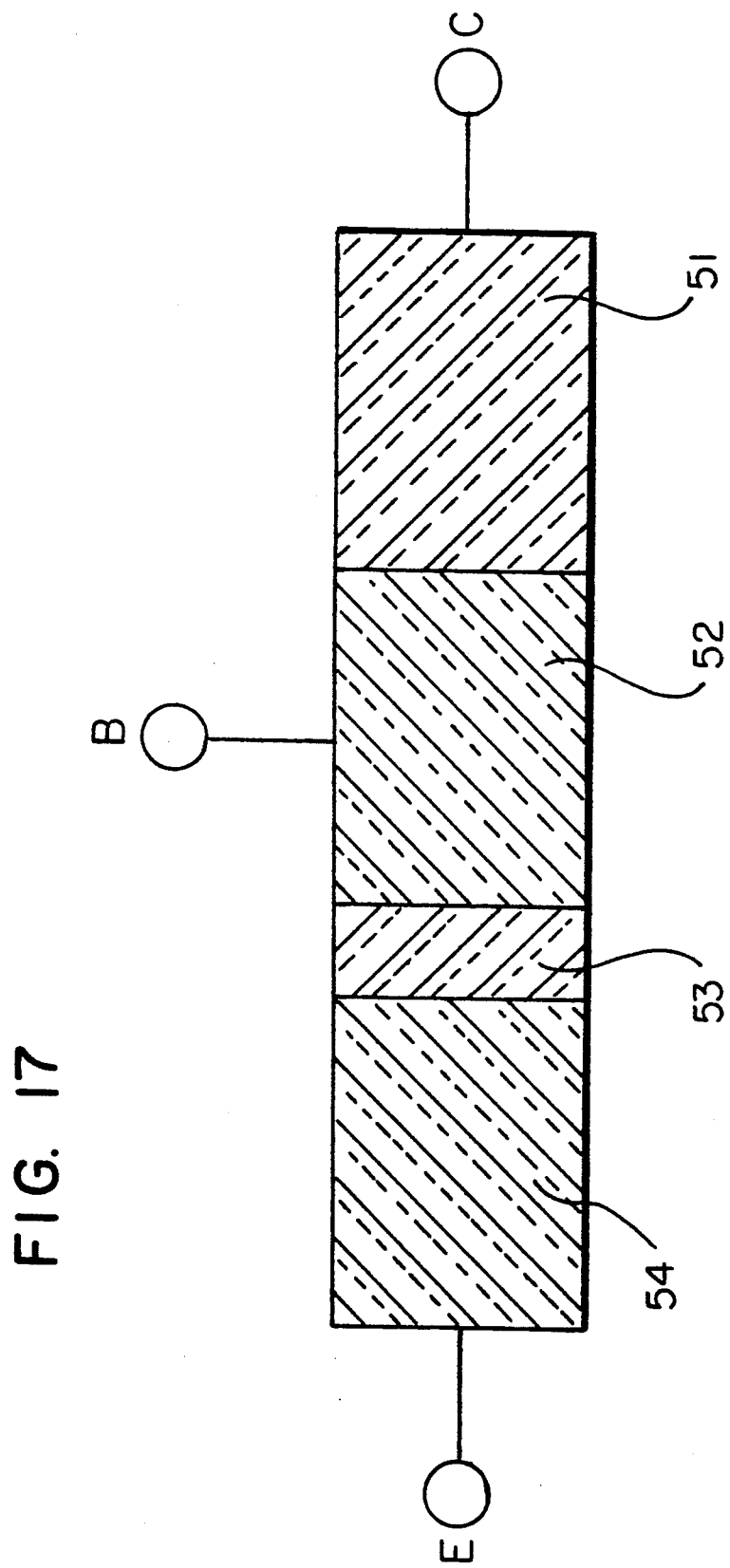

FIG. 13 shows X-ray diffraction patterns of Bi Sr Ca Cu O thin film 34 and FIG. 14 shows X-ray diffraction patterns of Bi Sr Cu O crystalline film 32. It has been confirmed that, as seen in these X-ray diffraction patterns, the Bi Sr Ca Cu O thin film 34 shows low Tc phase (2212 phase) and Bi Sr Cu O crystalline film 32 shows AKIMITSU phase (2201 phase).

When the Bi Sr Cu oxide thin film 32 having a thickness of 1000 Å and the Ca F$_2$ thin film 33 having a thickness of 700 Å were heat-treated at a temperature of 820° to 830° C., the Bi Sr Ca Cu O thin film 34 did not indicate zero resistance even when it was cooled to 10 K. However, when a heat-treating temperature of 840° to 870° C. was used, the thin film 34 indicated zero resistance.

At a heat-treating temperature of 840° C., the transfer temperature Tc (zero)=70 K. At a heat treating temperature of 860° C., the transfer temperature Tc (zero)=80 K. At a heat-treating temperature of 870° C., the transfer temperature Tc (Zero)=86 K. At a heat-treating temperature of 880° C. the Bi Sr Ca Cu O thin film 34 was partially stripped from substrate 1.

FIG. 15 shows curves of resistivity vs. temperature of Bi Sr Ca Cu O thin film 34 heat-treated from 3 hours in an atmosphere at 870° C. and of a crystalline film of Bi Sr Cu O. As seen in FIG. 15, the Bi Sr Ca Cu O thin film 34 showed 6.4 m ohm.cm of metallic temperature property at room temperature, and its Tc (zero) was 86 K. On the other hand, the Bi Sr Cu O crystalline film 32 showed 6.2 m ohm.cm of resistivity at room temperature, but did not show any superconducting property even when it was cooled to a temperature of 10 K.

Accordingly, at a temperature of less than 86 K, a superconductive phase/normal conductive phase/superconductive phase is formed between a pair of Bi Sr Ca Cu O thin films 34, 34 with a Bi Sr Cu O crystalline film 32a formed therebetween.

When the gap between the Ca F$_2$ thin films 33 and 33 was 5000 Å, an MgO insulating film 5, having a thickness of about 1000 Å was formed upon the pair of Bi Sr Ca Cu O superconducting thin films 34, 34 with a Bi Sr Cu oxide thin film 32a formed therebetween. Gate electrode 6, made of Au or Al, was formed upon insulating film 5, whereby a proximity-effect-type transistor was prepared.

If the thickness of the Bi$_{1.0}$ Sr$_{2.0}$ Cu$_{3.1}$ O$_x$ thin film 32 was d, and the thickness of Ca F$_2$ thin film 33 was x, a Bi Sr Ca Cu O superconducting thin film 34 showing suitable superconducting property was produced when: $0.3d \leq x \leq 1.0d$.

In the third embodiment, Sr$_{1.0}$ Ca$_{1.0}$ Cu$_{2.0}$ O$_x$, in which Bi is not included, was used in lieu of the sintered target Bi$_{1.0}$ Sr$_{1.0}$ Ca$_{1.0}$ Cu$_{2.0}$ O$_x$. By making use of Sr$_{1.0}$ Ca$_{1.0}$ Cu$_{2.0}$ O$_x$ containing no Bi therein in lieu of the sintered target Bi$_{1.0}$ Sr$_{1.0}$ Ca$_{1.0}$ Cu$_{2.0}$ O$_x$ used in the second embodiment, it is also possible to produce a tunnel-injection type and proximity-effect-type superconducting transistor.

In the fourth embodiment, Bi$_{1.0}$ Sr$_{1.0}$ Cu$_{2.0}$ O$_x$ containing Ca therein was used in lieu of the sintered target Bi$_{1.0}$ Sr$_{1.0}$ Ca$_{1.0}$ Cu$_{2.0}$ O$_x$ used in the first embodiment. By using a Bi$_{1.0}$ Sr$_{1.0}$ Cu$_{2.0}$ O$_x$ target containing no Ca used in the second embodiment, it is also possible to produce a tunnel-injection type and proximity-effect-type superconducting transistor.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A process for producing a superconducting semiconductor device comprising:
   forming a first thin film of a pre-superconductor on a surface of a substrate;
   said first thin film including a deficiency of a component required to make it superconductive, whereby said first thin film is a non-superconductor;
   depositing a second thin film, said second thin film covering less than all of said first thin film, in a pattern on a surface of said first thin film;
   said second thin film containing a proportion of said component; and
   heat treating said substrate with said first and second thin films thereon at a temperature, and for a time, effective to permit transfer of a sufficient portion of said component from said second thin film to said first thin film, to change portions of said first thin film, corresponding to said pattern, into superconducting areas and leaving a remainder of said first thin film non-superconducting.

2. A process according to claim 1, wherein:
   said pattern includes first and second regions separated by a gap; and
   said superconducting areas include first and second superconducting areas corresponding in position to said first and second regions, with a semiconducting gap therebetween.

3. A process according to claim 2 wherein said superconducting device is a transistor, further comprising:
   removing from said first thin film material of said second thin film which may remain after said heat treating;
   depositing a source electrode partially covering said first superconducting area and extending over a fist remaining portion of said first thin film;
   depositing a drain electrode partially covering said second superconducting area and extending over a second remaining portion of said first thin film;
   depositing an insulating thin film extending over said gap, and contiguous portions of said first and second superconducting areas; and
   depositing a gate electrode on said insulating thin film, whereby a field effect transistor is produced.

4. A process according to claim 1 wherein said superconducting device is a transistor, further comprising:
   depositing a third thin film, said third thin film being an insulating film adapted to function as a tunnelling layer, over the exposed surface of said first thin film and said second thin film;
   depositing a fourth thin film on said thin insulating film, generally congruent with said second thin film thereby covering a portion of said thin insulating film;
   depositing a fifth thin film over the exposed surface of said thin insulating film and said fourth thin film;
   said fifth thin film being a pre-superconductor including a deficiency of a second component required to make it superconductive;
   said fourth thin film containing a second proportion of said second component;
   heat treating the assembly thus formed for a time and at a temperature effective to permit transfer of a sufficient portion of said component from said second thin film to said first thin film to make said first thin film superconductive in said pattern; and said heat treating being further effective to permit transfer of a sufficient portion of said second component from said fourth thin film to said fifth thin film to make said fifth thin film conductive in said pattern.

5. A process according to claim 1, wherein said pattern is of a configuration effective to form a superconducting field effect transistor.

6. A process according to claim 1, wherein said pattern is of a configuration effective to form a superconducting tunnelling transistor.

7. A process according to claim 1, wherein said pattern is of a configuration effective to form a SNS transistor, wherein S is superconductive and N is semiconductive.

8. A process for producing a superconducting transistor, comprising:
   forming a pre-superconductive first thin film on a surface of an insulating substrate;
   forming a second thin film in a pattern defining two separate regions on said first thin film;
   said two regions being separated from each other by a slight gap;
   said first thin film being deficient in a component required to make it superconductive;
   said second thin film including a proportion of said component;
   heat treating the assembly formed in the preceding steps for a time and at a temperature effective to permit a sufficient amount of said component from said second thin film to enter said first thin film to make first and second superconducting areas in said pattern in said first thin film and leaving said gap non-superconducting;
   forming an insulating film over said slight gap and over contiguous portions of said first and second superconductive areas;
   forming a gate electrode on said insulating film;
   forming a source electrode over a portion of said first superconductive area and a contiguous portion of said first thin film; and
   forming a drain electrode over a portion of said second superconductive area and a contiguous portion of said first thin film.

9. A process according to claim 8, wherein:
   said first thin film is a Bi Sr Ca Cu O composition;
   a ratio of Bi in said first thin film being less than required to permit superconduction; and
   said second thin film is Bi oxide.

10. A process according to claim 9, wherein if a thickness of said first thin film is d, and a thickness of said second thin film is x, a relationship of $0.02d \leq x \leq 0.17d$ is followed.

11. A process according to claim 8, wherein: said first thin film is a Sr Ca Cu composition; and said second thin film is Bi oxide.

12. A process according to claim 11, wherein if a thickness of said first thin film is d, and a thickness of said second thin film is x, a relationship of $0.3d \leq x \leq 0.8d$ is followed.

13. A process according to claim 8, wherein: said first thin film is a Bi Sr Cu composition; and said second thin film is Ca fluoride.

14. A process according to claim 13, wherein if a thickness of said first film is d, and a thickness of said second thin film is x, a relationship of $0.3d \leq x \leq 1.0d$ is followed.

15. A process for producing a superconducting transistor, comprising:
   forming a pre-superconducting first thin film on a surface of a substrate;
   said first thin film being deficient in a component required for said first thin film to be superconductive;
   forming a second thin film in a pattern on said first thin film thereby covering a portion of said first thin film;
   said second thin film containing a proportion of said component;
   forming an insulating thin film on said second thin film and the exposed surface of said first thin film;
   forming a third thin film on said insulating thin film thereby covering a portion of said insulating thin film;
   forming a pre-superconducting fourth thin film on said third thin film and the exposed surface of said insulating thin film;
   said fourth thin film being deficient in said component required for said fourth thin film to be superconductive;
   said third thin film containing a proportion of said component;
   heat treating the assembly formed in the preceding steps for a time and at a temperature to permit said component from said second thin film to enter said first thin film in a quantity effective to make a congruent portion of said first thin film a first superconductive region;
   the step of heat treating being further effective to permit said component from said third thin film to enter said fourth thin film in a quantity effective to make a congruent portion of said fourth thin film a second superconductive region; and
   said first thin film being a collector, said first superconductive region being a base, and said second superconductive region being an emitter.

16. A process according to claim 15, wherein:
   said first and fourth thin films are Bi Sr Ca Cu compositions;
   a proportion of Bi in said first and fourth thin films being insufficient to permit superconductivity therein; and
   said second and third thin film being Bi oxide.

17. A process according to claim 16, wherein, if a thickness of said first and fourth thin films is d, and a thickness of said second and third thin films is x, a relationship of $0.02d \leq x \leq 0.17d$ is followed.

* * * * *